(12) United States Patent
Lewicki et al.

(10) Patent No.: US 7,555,091 B1
(45) Date of Patent: Jun. 30, 2009

(54) SYSTEM AND METHOD FOR PROVIDING A CLOCK AND DATA RECOVERY CIRCUIT WITH A SELF TEST CAPABILITY

(75) Inventors: Laurence D. Lewicki, Sunnyvale, CA (US); Amjad T. Obeidat, Santa Clara, CA (US); Nicolas Nodenot, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 559 days.

(21) Appl. No.: 10/973,131

(22) Filed: Oct. 26, 2004

(51) Int. Cl.
*H03D 3/24* (2006.01)

(52) U.S. Cl. .................. 375/376; 375/224; 327/156; 714/30; 714/733

(58) Field of Classification Search .......... 375/376, 375/371, 224, 226; 714/30, 724, 733–734; 327/156
See application file for complete search history.

(56) References Cited

U.S. PATENT DOCUMENTS

| | | | | |
|---|---|---|---|---|
| 6,570,944 B2 * | 5/2003 | Best et al. | ............ | 375/355 |
| 7,180,352 B2 * | 2/2007 | Mooney et al. | ............ | 327/237 |
| 7,376,528 B2 * | 5/2008 | Ribo | ............ | 702/108 |
| 2004/0202266 A1 * | 10/2004 | Gregorius et al. | ............ | 375/355 |
| 2006/0233291 A1 * | 10/2006 | Garlepp et al. | ............ | 375/355 |

* cited by examiner

Primary Examiner—Jean B Corrielus

(57) ABSTRACT

A system and method is disclosed for providing a clock and data recovery circuit with a self test capability. A test control unit is provided that causes the clock and data recovery circuit to continuously alter a phase of an interpolated clock signal. A user selects a preselected bit pattern that causes the digital control circuitry of the clock and data recovery circuit to advance or retard the phase of the interpolated clock signal. The test control unit compares the advanced or retarded phase of the interpolated clock signal with a reference clock signal to determine a frequency difference between the two clock signals. The test control unit uses the frequency difference to determine the test status of the clock and data recovery circuit.

18 Claims, 5 Drawing Sheets

SYSTEM AND METHOD FOR PROVIDING A CLOCK AND DATA RECOVERY CIRCUIT WITH A SELF TEST CAPABILITY

TECHNICAL FIELD OF THE INVENTION

The present invention is generally directed to the manufacture of clock and data recovery circuits for semiconductor devices and, in particular, to a system and method for providing a clock and data recovery circuit having a self test capability.

BACKGROUND OF THE INVENTION

A clock and data recovery (CDR) circuit is an integral part of a modern data communication system. A CDR circuit is connected to and interfaces with a data signal line that carries incoming data. The CDR circuit performs the function of extracting the incoming data and clock information from the incoming data stream. This function is typically performed with an electronic control loop that detects the incoming data. Based on the data edge locations in time, the electronic control loop makes a determination of the instantaneous phase of the data.

The electronic control loop subsequently aligns the electronic control loop's own internal clock with the phase of the incoming data. This alignment allows the CDR circuit to sample the data in the middle of the bit period to ensure that a maximum signal-to-noise ratio is achieved. The aligned clock signal is also referred to as the recovered clock signal because it represents a clock signal that is synchronous with the recovered data.

There are two main architectures in the prior art that are used to construct a clock and data recovery (CDR) circuit. The primary difference between the two systems is the way the recovered clock signal is generated. A first CDR type system generates the recovered clock signal with a voltage controlled oscillator (VCO). The VCO based system is capable of generating the recovered clock signal at the same frequency as the data. In addition, the VCO based system can vary the recovered clock phase to match the phase of the data.

A second CDR type system uses a phase interpolator to vary the phase of a reference clock signal that is supplied to it from another on-chip block (typically, a phase-lock loop (PLL)) that produces a nominal clock frequency that matches the nominal frequency of the incoming data. The interpolator produces a new clock signal with an interpolated phase that is varied to match the phase of the incoming data. This clock signal is then used to sample the data in the middle of the bit period. The interpolated clock signal, in this case, is also referred to as a recovered clock signal. Even though this system (i.e., the interpolated phase system) uses a reference clock signal with a fixed frequency, it can still adjust the interpolated clock frequency to match the variation in frequency of the incoming data. The frequency shift is accomplished by continuously varying the phase of the interpolated clock signal to translate it into a frequency shift.

The electronic control loop uses a phase detector at its input to compare the phase of the incoming data to the phase of the internal clock signal. The phase detector determines whether the clock phase is early or late relative to the incoming data signal. The electronic control loop subsequently makes a decision to vary the phase of the internal clock signal in such a way as to eliminate the phase difference between the clock signal and the incoming data signal.

The data sampling is accomplished through the use or input comparators that are driven from one or more phases of the internal (i.e., recovered) clock signal. Under ideal conditions, these comparators sample each data bit in the middle of the bit period and make a determination whether the bit is zero or the bit is one and pass on the decision as the recovered data.

A clock and data recovery (CDR) circuit of the phase interpolator variety tracks an incoming data stream by continuously varying the phase of the internal (i.e., recovered) clock signal through phase interpolation. A system that uses a phase interpolator CDR circuit can be used to recover data with a bandwidth that is higher than the native capability of the process technology. For example, it is possible to use a phase interpolator CDR system to recover a data stream running at four Gigabytes per second (4 Gb/s) while using a process technology that can not operate at frequencies higher than one Gigahertz per second (1 GHz/s).

In such a case, the data stream is broken down into several parts and each part is processed in parallel at a lower speed. More specifically, the number of input comparators can be increased and these comparators no longer need to sample every consecutive bit. In the example mentioned above, this means that the number of comparators must be increased from one comparator to four comparators. Each of the four comparators would sample the data at a rate of one Giga sample per second (1 Gsample/s). Therefore, each of the four comparators samples every fourth bit from the data stream. The output of the four comparators is subsequently combined in the correct order to reconstruct the data stream.

In practice a system that uses a phase interpolator CDR circuit acquires more than one sample per bit in order to determine the phase of a given bit. In fact, two samples per bit are required in order for the phase detector to make an early-or-late determination for each bit. Therefore, for a CDR circuit with an internal clock running at the same frequency as that of the data stream, two comparators are used to sample the data stream. The two comparators, in this case, are driven by two clock phases that are separated by one hundred eighty degrees (180°). This results in a sample taken in the middle of the bit period (the data sample) and a sample taken near the edge of the bit period (the edge sample) as shown in FIG. 1.

A CDR circuit that operates at the same rate as the data rate of the incoming data stream would need two input comparators, a first input comparator for sampling the data in the middle of the bit period, and a second input comparator for sampling the edge of the bit period. This type of sampling is called "full rate, double sampling." A CDR circuit that operates at one half of the data rate of the incoming data stream would need four input comparators. This type of sampling trades off more circuitry (and corresponding area) for a relaxation in the speed requirement. This type of sampling is called "half rate, double sampling."

Finally, as the incoming data bits are sampled, they are processed by digital control circuitry that looks for bit transitions and determines whether the clock is sampling too early or too late. This is accomplished by comparing three consecutive data-edge-data samples and looking for a data transition. If there is no data transition in the data bit, then the sample set does not produce phase information. Otherwise, the three samples are compared. If the edge sample is the same as the first data sample, then the sampling clock is early. This situation is illustrated in FIG. 2. On the other hand, if the edge sample is the same as the second data sample, then the clock is late. This situation is illustrated in FIG. 3.

These early and late decisions are accumulated and used to advance or retard the phase of the interpolated clock signal. This is accomplished by a Finite State Machine (FSM) block that controls the phase interpolator and sets the phase position of the recovered clock signal.

Various types of prior art systems exist that use the double sampling technique for each bit in order to recover the clock and data information. The data and edge samples are produced by a digital filter and are used to make phase advancement or retardation decisions. U.S. Pat. No. 6,002,279 issued on Dec. 14, 1999 to W. P. Evans et al. entitled "Clock Recovery Circuit" discloses a CDR architecture in which a digital filter is implemented as a divide-by-sixteen (16) block and a phase interpolator is driven by a bank of nonlinear digital-to-analog converters (DACs). The nonlinear DACs are needed to maintain an appropriate bias condition for the bipolar phase interpolator circuit.

U.S. Pat. No. 6,122,336 issued on Sep. 19, 2000 to M. B. Anderson entitled "Digital Clock Recovery Circuit With Phase Interpolation" discloses a CDR architecture that uses an all-CMOS implementation which does not require the use of nonlinear digital-to-analog converters (DACs). This design uses phase interpolators to generate a large number of fine increments in the recovered clock phase. This design then uses a phase selection unit to pick an appropriate phase used in sampling the data. This implementation requires the generation of a large number of phases for the phase selection unit to choose from.

This added complexity is addressed in United States Patent Application No. 2003/0002607 A1 published on Jan. 2, 2003 by S. R. Mooney et al. entitled "Clock Recovery Using Clock Phase Interpolator." This system eliminates the phase selection unit with a fast phase interpolator with fine increment resolution. The system starts with a delay-lock loop (DLL) that generates four clock phases. These phases are then fed to a phase interpolator that generates the final, desired clock phase. The phase interpolator is driven by a control circuit that takes the output of the phase detector and converts it to a digital signal using an analog-to-digital converter (ADC). The need for an ADC adds to the complexity of the implementation.

This added complexity is addressed in a paper entitled "A 0.4-4 Gb/s CMOS Quad Transceiver Cell Using On-Chip Regulated Dual Loop PLLs" by K.-Y. K. Chang et al. published in the IEEE Journal of Solid-State Circuits, Volume 38, No. 5, pp. 747-754, May 2003. This system uses binary phase detectors that determine whether the sampling clock is early or late. These binary signals can be fed directly into the control logic circuitry to make the determination whether the phase interpolator should advance or retard the phase of the sampling (i.e., recovered) clock signal.

From the discussion and the references cited above it is clear that a canonical form exists for phase interpolator-based clock and recovery circuits. In general the prior art circuits contain a phase locked loop (PLL) or a delay lock loop (DLL) to generate the initial clock phases, one or more phase interpolators that generate the recovered clock signal, two or more phase detectors that determine the relationship of the clock signal relative to the data signal, and mixed-signal or digital control circuitry that determines the appropriate clock phase and controls the phase interpolators.

In prior art manufacturing systems, expensive testing equipment must be used to test the reliability of clock and data recovery circuits. Typically, a high speed clock and data recovery circuit that runs at frequencies above one megahertz (1 MHz) requires high speed, expensive test equipment. In industrial applications, high speed test requirements necessitate high speed tester options that can cost more than one half of a million dollars ($500,000). This cost translates directly into reduced margins for the price of the clock and data recovery circuit. Expensive test equipment would not be necessary if a clock and data recovery circuit could perform its own testing function.

Therefore, there is a need in the art for a system and method for providing a clock and data recovery circuit that has a self test capability. There is also a need in the art for a system and method for self testing a clock and data recovery circuit that reduces the amount of time, expense, and test equipment that is required to perform testing on a clock and data recovery circuit.

SUMMARY OF THE INVENTION

To address the above-discussed deficiencies of the prior art, it is a primary object of the present invention to provide a system and method for providing a clock and data recovery circuit that has a self test capability.

In one advantageous embodiment of the present invention, a test control unit is provided for a clock and data recovery circuit. The clock and data recovery circuit comprises a plurality of comparators, a data alignment path unit, a plurality of phase detectors, digital control circuitry, and plurality of phase detectors, connected in a loop configuration.

The test control unit causes the clock and data recovery circuit to continuously alter a phase of an interpolated clock signal in the clock and data recovery unit. A user selects a preselected bit pattern and enters the preselected bit pattern into the test control unit. The test control unit imposes the preselected bit pattern on the phase detectors. This causes the digital control circuitry of the clock and data recovery circuit to advance or retard the phase of the interpolated clock signal.

The test control unit then compares the advanced or retarded phase of the interpolated clock signal with a reference clock signal to determine a frequency difference between the two clock signals. The test control unit then uses the frequency difference to determine the test status of the clock and data recovery circuit. The test control unit then outputs a pass signal or a fail signal on a signal line to an external display device that is accessible by the user. In this manner the test control unit is capable of determining the operational test status of a clock and data recovery circuit without the use of expensive external test equipment.

It is an object of the present invention to provide a system and method for providing a clock and data recovery circuit that has a self test capability.

It is also an object of the present invention to provide a system and method that reduces the amount of time, expense, and test equipment that is required to perform testing on a clock and data recovery circuit.

It is yet another object of the present invention to provide a system and method that increases the manufacturing profit margin for a clock and data recovery circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
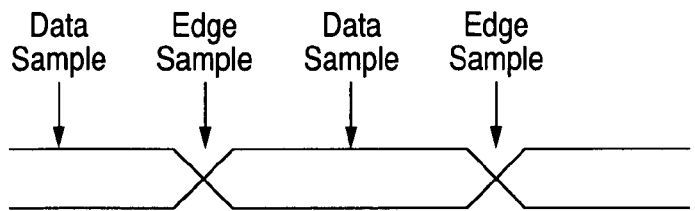
FIG. 1 illustrates a prior art input data signal with arrows that show locations where a data sample may be taken in the middle of a bit period and where an edge sample may be taken near the edge of a bit period.
Figure 2:
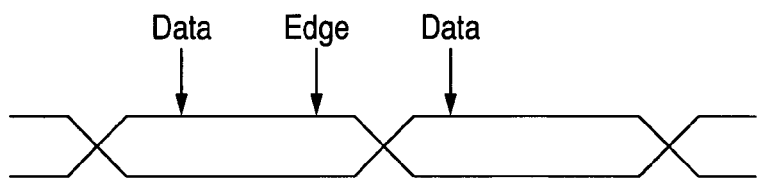
FIG. 2 illustrates a prior art input data signal in which three consecutive data-edge-data samples have been taken and in which the edge sample is the same as the first data sample indicating that the sampling clock is early.
Figure 3:
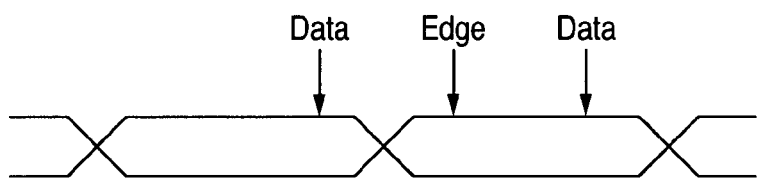
FIG. 3 illustrates a prior art input data signal in which three consecutive data-edge-data samples have been taken and in which the edge sample is the same as the second data sample indicating that the sampling clock is late.
Figure 10:
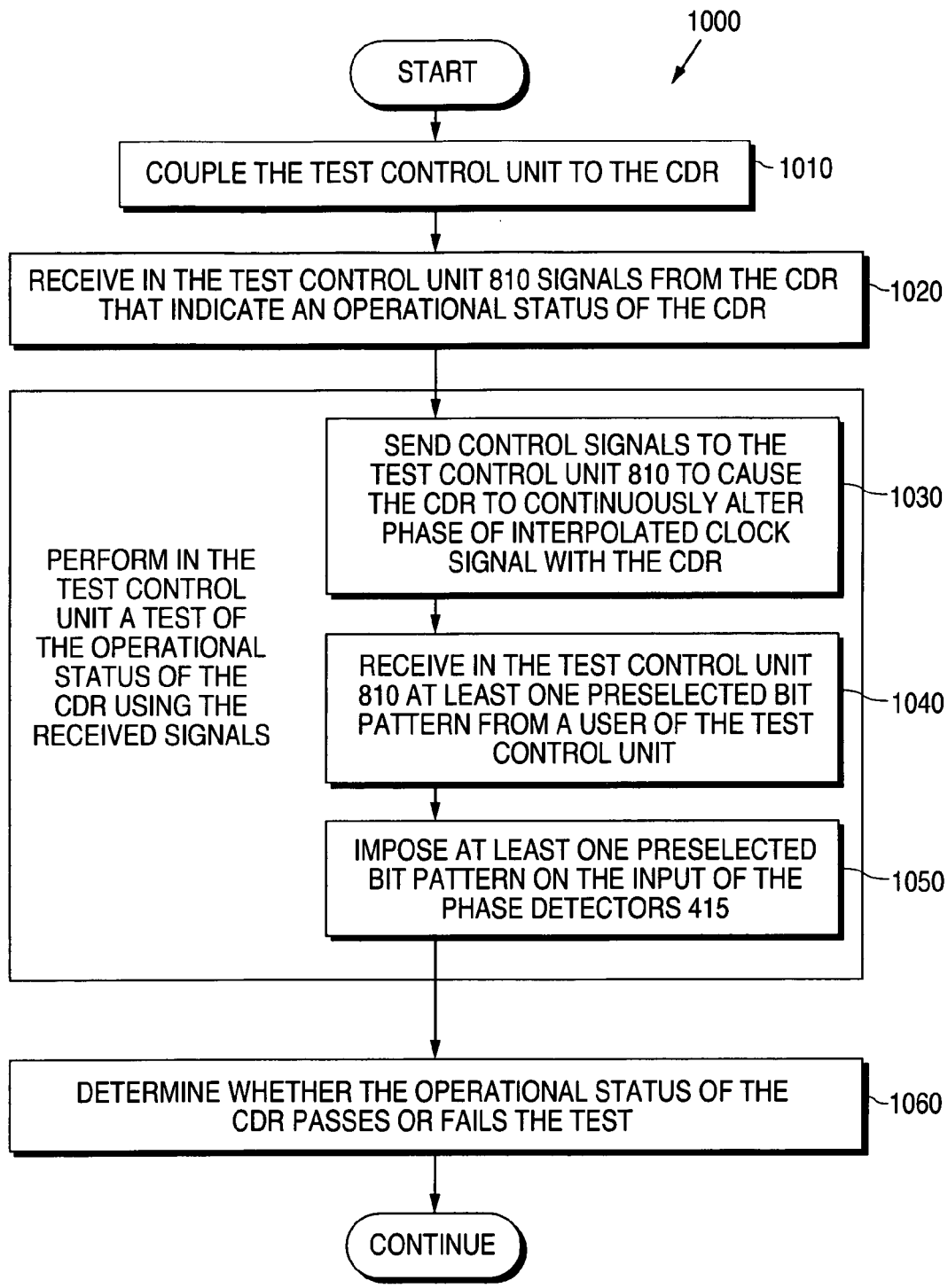
FIG. 10 illustrates a flow chart showing an advantageous embodiment of a method of the present invention.

FIGS. 1 and 10 and the various embodiments used to describe the principles of the present invention in this patent document are by way of illustration only and should not be construed in any way to limit the scope of the invention. Those skilled in the art will understand that the principles of the present invention may be implemented in any type of suitably arranged clock and data recovery system.

To simplify the drawings the reference numerals from previous drawings will sometimes not be repeated for structures that have already been identified.

Figure 4:
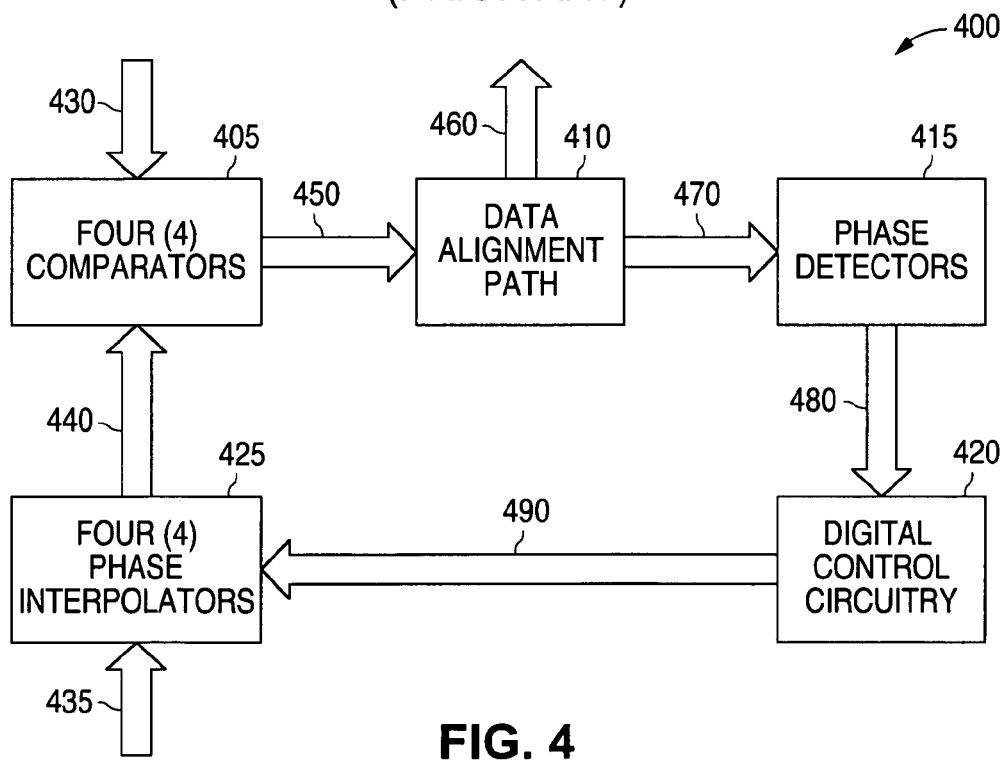
FIG. 4 illustrates a schematic diagram of a prior art clock and data recovery circuit.

In order to better understand the principles of the present invention a description of a prior art clock and data recovery system will first be given. FIG. 4 illustrates a schematic diagram of a prior art clock and data recovery circuit 400 that employs phase interpolator architecture. The clock and data recovery circuit 400 requires four (4) clock phases that are generated by a phase locked loop (PLL) (not shown in FIG. 4). The four clock phases are ninety degrees (90°) apart in phase and run at one half of the frequency of the incoming data stream. The four clock phases from the PLL are represented in FIG. 4 by arrow 435. The four clock phases are provided to a bank of four (4) phase interpolators 425 that are used to generate the recovered clock signal. The four interpolated clock phases from the four interpolators 425 (represented by arrow 440) are used to drive four input comparators 405 that sample the incoming data stream. The incoming data stream is represented in FIG. 4 by arrow 430.

The sampled data from the four input comparators 405 is provided to a data alignment path unit 410. The sampled data that is provided to the data alignment path unit 410 is represented in FIG. 4 by arrow 450. The data alignment path unit 410 provides an output signal that represents the clock and data output. The clock and data output from data alignment path unit 410 is represented in FIG. 4 by arrow 460.

The data alignment path unit 410 also provides an output signal to phase detectors 415. The output signal from data alignment path unit 410 to phase detectors 415 is represented in FIG. 4 by arrow 470. The phase detectors 415 determine whether the sampling moment is early or late for each bit. If the phase detectors 415 are not able to make a determination whether the sampling moment is early or late for each bit, they output a signal that represents a "no information" result. The phase detectors 415 provide an output that represents the "early/late/no info" information to digital control circuitry 420. The output that represents the "early/late/no info" information is represented in FIG. 4 by arrow 480.

The digital control circuitry 420 operates on the information from the phase detectors 415 to determine the appropriate clock phase to be used. The loop is completed when the digital control circuitry 420 sends interpolator control signals to the four phase interpolators 425. The interpolator control signals from digital control circuitry 420 are represented in FIG. 4 by arrow 490.

When the four input comparators 405 sample the incoming data stream 430 the four input comparators 405 translate portions of the incoming data stream 430 into a logic zero ("0") or a logic one ("1"). There are four (4) comparators in the input comparator block 405 that perform this function. These four comparators are driven by a variable phase clock signal (i.e., the recovered clock signal) to sample the signal in the middle of the data bit period.

As data is received, the bit stream is analyzed by the logic section of clock and data recovery circuit 400. The logic section comprises the data alignment path unit 410, the phase detectors 415, and the digital control circuitry 420. As previously mentioned, the phase detectors 415 determine whether the sampling moment is early or late (or no information is available) for each bit. The phase detectors 415 provide the "early/late/no info" decisions 480 to the digital control circuitry 420.

The digital control circuitry 420 accumulates the "early/late/no info" decisions and makes a determination whether the phase of the sampling clock should be advanced or retarded. The determination that is made with respect to advancing or retarding the sampling clock is translated into control signals 490 to be provided to the phase interpolators 425. The phase interpolators, in response, adjust the phase of the sampling clocks that feed into the four input comparators 405.

The clock and data recovery circuit 400 shown in FIG. 4 is capable of operating at frequencies that are lower than the frequency of the input data stream 430. In particular, the four input comparators 405 allow the clock and data recovery circuit 400 to sample the incoming data stream 430 at one half of the data rate of the incoming data stream 430. Further parallelization in the data path in the logic section of the clock and data recovery circuit 400 enables the frequency of the logic section to be decreased by an additional factor of two or more.

Figure 5:
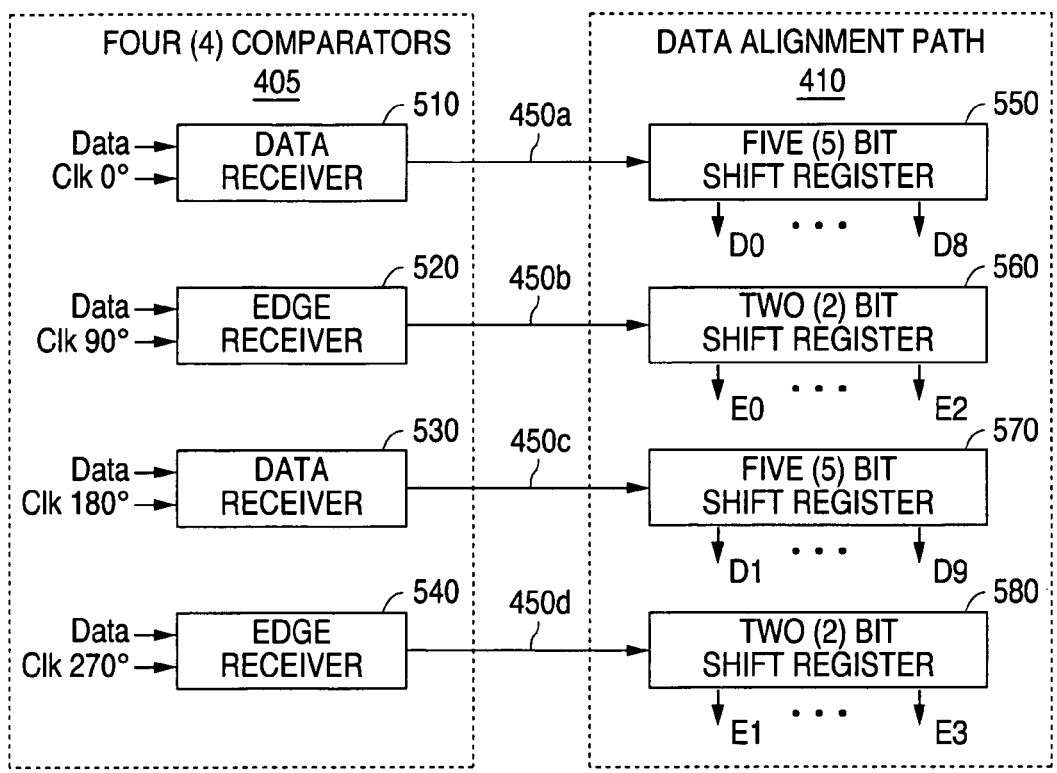
FIG. 5 illustrates a schematic diagram showing a more detailed view of the four comparators and data alignment path shown in FIG. 4.

The clock and data recovery circuit 400 shown in FIG. 4 comprises a mixture of analog blocks and digital blocks that are connected in a loop that controls the clock and data recovery function. The clock and data recovery circuit 400 works by taking two samples for every incoming bit. The first sample is a data sample in the middle of the bit period and the second sample is an edge sample in the bit transition region. The clock and data recovery circuit 400 samples two bits at a time by employing four input comparators 405 that are sampling with a phase shift of ninety degrees (90°) between each of the four input comparators 405. A more detailed view of the four input comparators 405 is shown in FIG. 5.

The first comparator is a data receiver 510 that receives as input the data and a clock signal at a phase of zero degrees (0°). The second comparator is an edge receiver 520 that receives as input the data and a clock signal at a phase of ninety degrees (90°). The third comparator is a data receiver 530 that receives as input the data and a clock signal at a phase of one hundred eighty degrees (180°). The fourth comparator is an edge receiver 540 that receives as input the data and a clock signal at a phase of two hundred seventy degrees (270°).

The output of the four comparators (510, 520, 530, 540) generates four streams of sampled information that is fed to four parallel shift registers in the data alignment path unit 410. A more detailed view of the data alignment path unit 410 is also shown in FIG. 5.

The output 450*a* from data receiver 510 is provided to five (5) bit shift register 550. The output 450*b* from edge receiver 520 is provided to two (2) shift register 560. The output 450*c* from data receiver 530 is provided to five (5) bit shift register 570. the output 450*d* from edge receiver 540 is provided to two (2) bit shift register 580.

The shift registers (550, 560, 570, 580) hold the sampled data for five (5) clock cycles. The data that is held in the shift registers of data alignment path unit 410 is passed out of the clock and data recovery circuit 400 in a ten (10) bit parallel bus (not shown) that operates at one tenth (1/10) of the data rate of the incoming data stream 430. The clock and data recovery circuit 400 also generates a divide-by-ten (10) version of the recovered clock signal that accompanies the parallel data. This divide-by-ten (10) clock signal is derived from one of the interpolated phases of the clock and data recovery circuit 400.

Figure 6:
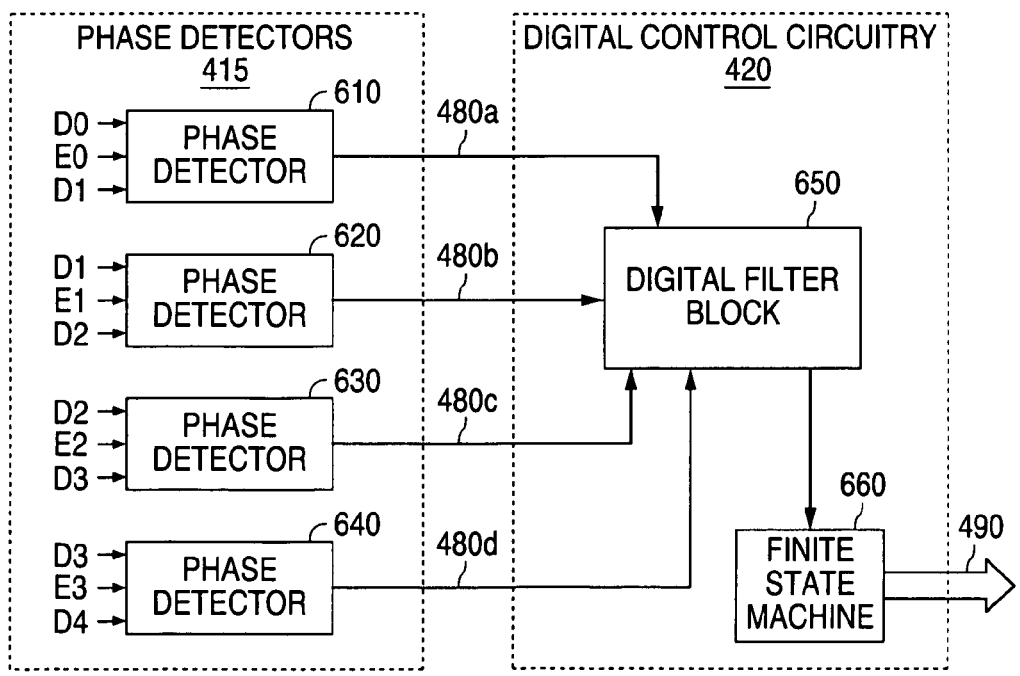
FIG. 6 illustrates a schematic diagram showing a more detailed view of the phase detectors and the digital control circuitry shown in FIG. 4.

The data alignment path unit 410 also provides the sampled data to the phase detectors 415. A more detailed view of the phase detectors 415 and the digital control circuitry 420 is shown in FIG. 6. Digital control circuitry 420 comprises digital filter block 650 and finite state machine 660.

Phase detector 610 receives data signals D0, E0, and D1 from data alignment path unit 410. Phase detector 620 receives data signals D1, E1, and D2 from data alignment path unit 410. Phase detector 630 receives data signals D2, E2, and D3 from data alignment path unit 410. Phase detector 640 receives data signals D3, E3, and D4 from data alignment path unit 410.

Phase detector 610 provides an "early/late/no info" data signal 480*a* to digital filter block 650 of digital control circuitry 420. Phase detector 620 provides an "early/late/no info" data signal 480*b* to digital filter block 650 of digital control circuitry 420. Phase detector 630 provides an "early/late/no info" data signal 480*c* to digital filter block 650 of digital control circuitry 420. Phase detector 640 provides an "early/late/no info" data signal 480*d* to digital filter block 650 of digital control circuitry 420.

The digital control circuitry 420 processes the sampled data to determine whether the clock and data recovery circuit 400 is sampling too early, or sampling too late, or sampling in the center. This data processing function is performed by the digital filter block 650 and the finite state machine 660. The digital filter block 650 is an accumulator and zero-crossing detector that analyzes the bit transition information in the data stream to decide whether the clock and data recovery circuit 400 is early or late. The digital filter block 650 then accumulates these early/late decisions into a variable bit-depth accumulator that acts as a digital loop filter. The accumulator can be designed to have any value of bit depth suitable to the system.

If the digital filter block 650 completes a full revolution in the clockwise direction then the digital filter block 650 sends an "up" signal to the finite state machine 660. If the digital filter block 650 completes a full revolution in the counter clockwise direction then the digital filter block 650 sends a "down" signal to the finite state machine 660. The "up" and "down" signals are fed into the finite state machine 660 and the finite state machine 660 translates the "up" and "down" signals into position information in phase space for the phase interpolators 425. The signals from the finite state machine 660 to the phase interpolators 425 are represented in FIG. 6 (and in FIG. 4) by arrow 490.

The finite state machine 660 keeps track of the phase interpolator position by processing the "up" and "down" signals from the digital filter block 650 and producing quadrant and phase position information. The quadrant signal is transmitted on a two bit bus (not shown) that is gray coded to ensure a maximum of one bit transition at a time. The phase position signal is transmitted on a fifteen bit bus (not shown) that is thermometer encoded. This arrangement also ensures a maximum of one bit transition at a time. In addition, the finite state machine 660 is designed not to have a quadrant transition and a phase transition occur at the same time. This feature minimizes the amount of internal jitter generated by the system.

Figure 7:
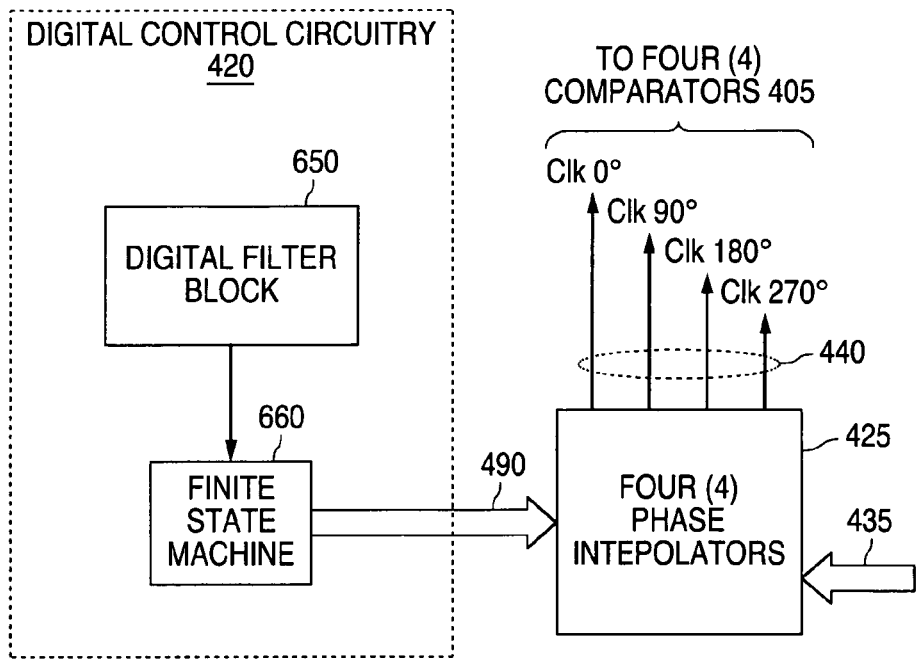
FIG. 7 illustrates a schematic diagram showing a more detailed view of the connection of the digital control circuitry to the four phase interpolators shown in FIG. 4.

As shown in FIG. 7, the output (represented by the arrow 490) of finite state machine 660 is provided to the four phase interpolators 425. As previously described, the four phase interpolators 425 also receive four clock phases (represented by the arrow 435) from the PLL (not shown) that are ninety degrees (90°) apart in phase and that run at one half of the frequency of the incoming data stream 430. The four phase interpolators 425 generate four interpolated clock phases 440 and output them to the four input comparators 405. As shown in FIG. 7, the four interpolated clock phases 440 are ninety degrees (90°) apart in phase.

One of the important features of clock and data recovery circuit 400 is its ability to recover signals that run at a higher rate than the sampling clock of the clock and data recovery circuit 400. This is accomplished by deploying a number of parallel paths to recover and process the data. The processing frequency of the four input comparators 405 is dropped by a factor of two from the data rate of the incoming data stream 430 by using four comparators instead of two comparators.

Later, the data is loaded into the shift registers (550, 560, 570, 580) of the data alignment path unit 410 where the incoming data bits are stored for five clock cycles. The bit information is processed four bits at a time in parallel with the digital filter block 650. This means that the clock frequency of the digital filter block 650 may be dropped by another factor of two. This down-stepping of operating frequency enables such a design to process data that is running at a higher bandwidth than the process technology can normally handle. The clock signal (not shown) that drives the digital filter block 650 and the finite state machine 660 is derived from one of the interpolated clock phases of the clock and data recovery circuit 400.

Figure 8:
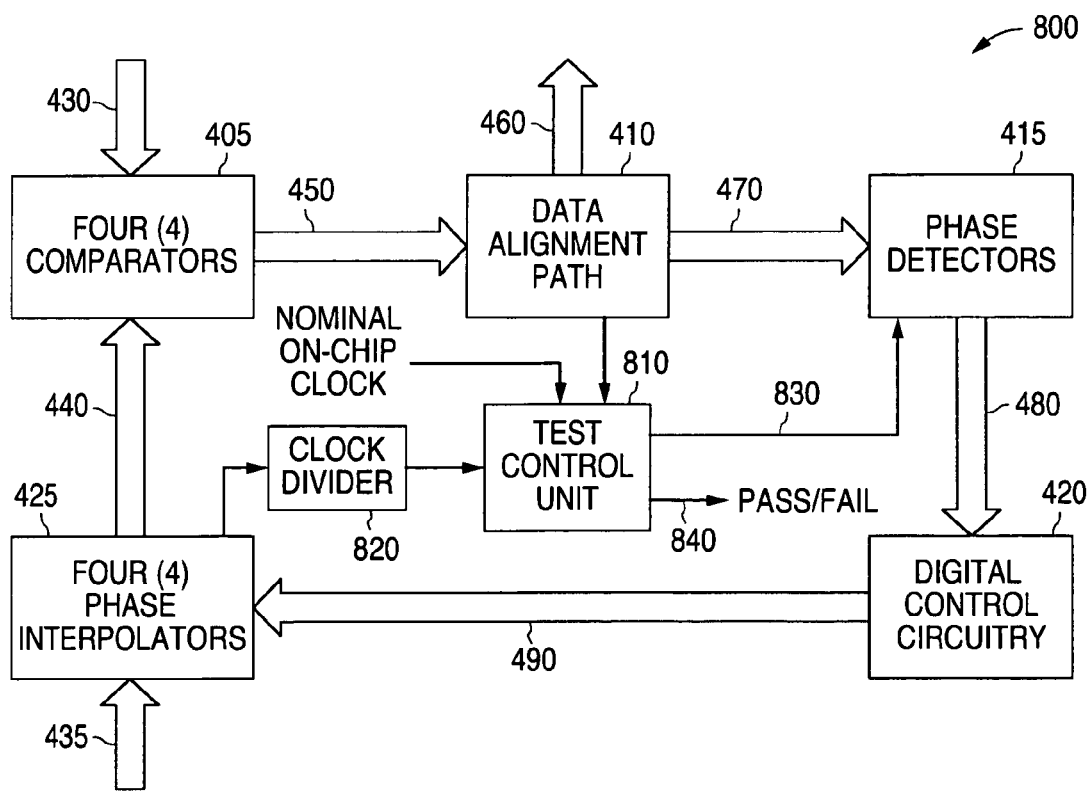
FIG. 8 illustrates a schematic diagram showing a test control unit of the present invention coupled to the clock and data recovery circuit shown in FIG. 4.

FIG. 8 illustrates a schematic diagram showing a test control unit 810 of the present invention coupled to the clock and data recovery circuit 400 shown in FIG. 4. The clock and data recovery circuit that comprises test control unit 810 will be referred to with reference numeral 800.

As shown in FIG. 8, a clock divider unit 820 receives an input from the four phase interpolators 425. Clock divider unit 820 generates a divided clock signal and provides the divided clock signal to test control unit 810. Test control unit 810 also receives a clock signal from a nominal on-chip clock (not shown in FIG. 8). Test control unit 810 also provides control signals to phase detectors 415 through control line 830. Test control unit 810 also provides test results (e.g., pass or fail) to external locations (not shown in FIG. 8) through signal line 840. The operation of test control unit 810 will now be described.

The test control unit 810 provides self test capability to the clock and data recovery circuit 800. The test control unit 810 of the clock and data recovery circuit 800 is capable of diagnosing the functionality of the majority of the elements in the clock and data recovery loop. The test control unit 810 can then subsequently inform external portions of the system (via signal line 840) whether the circuitry of clock and data recovery circuit 800 has passed or failed a test that has been performed by test control unit 810.

Figure 9:
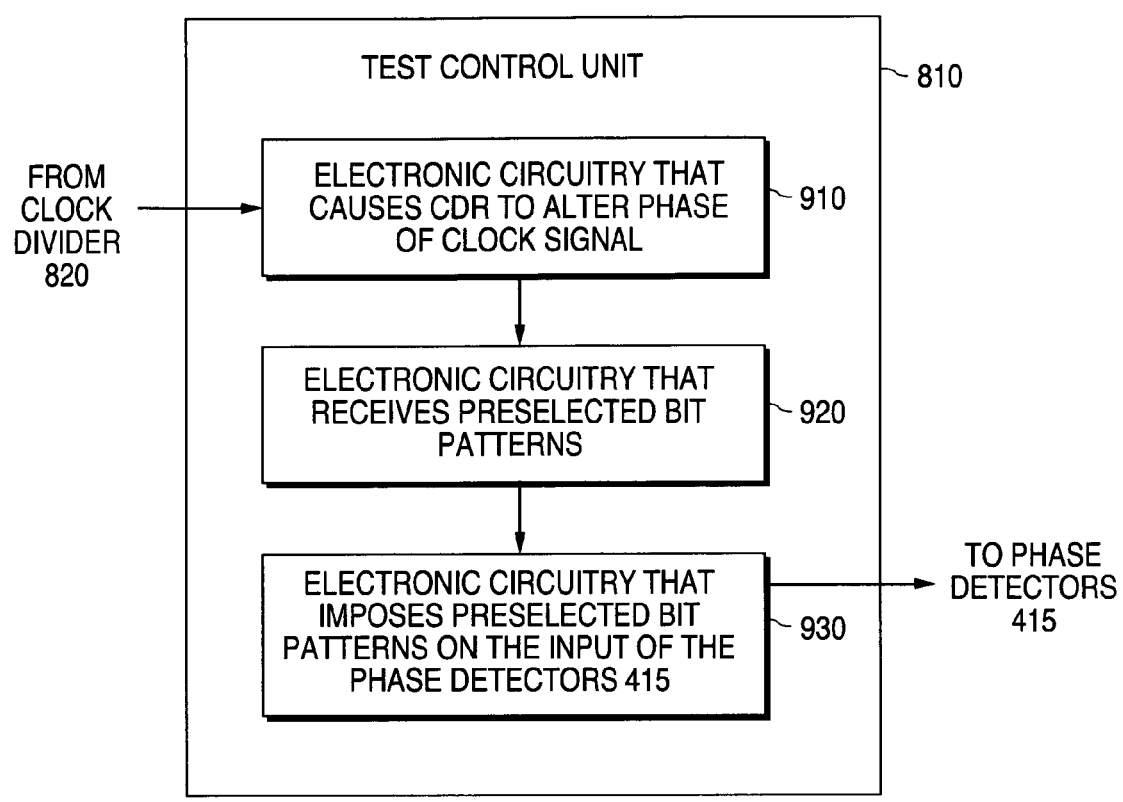
FIG. 9 illustrates a schematic diagram shown a more detailed view of the test control unit of the present invention.

The test control unit 810 begins a test by forcing the clock and data recovery circuit 800 to continuously alter the phase of the interpolated clock. This step is accomplished by the electronic circuitry 910 that is shown in FIG. 9. This is accomplished by imposing a preselected (i.e., known) bit pattern at the input of the phase detectors 415. The preselected bit pattern causes the digital control circuitry 420 to continuously advance or retard the phase of the recovered clock system. This step is accomplished by the electronic circuitry 920 and the electronic circuitry 930 that is shown in FIG. 9. This constant phase adjustment results in a frequency skew between the recovered clock signal and the nominal on-chip system clock signal that is generated by the on-chip phase locked loop (PLL). The frequency difference between the two clocks is measured and a pass/fail signal is asserted on signal line 840 to communicate the status of the clock and data recovery circuit 800 to the external system. The operator can choose whether to test the clock and data recovery circuit 800 with a positive frequency offset or with a negative frequency offset (or with both a positive and a negative frequency offset).

The test that is performed by the test control unit 810 can be used as a substitute for the normal tests that are used to characterize clock and data recovery circuits of this type on an automatic tester. Typically, a high speed clock and data recovery circuit that runs at frequencies above one megahertz (1 MHz) requires high speed, expensive test equipment. In industrial applications, high speed test requirements necessitate high speed tester options that can cost more than one half of a million dollars ($500,000). This cost translates directly into reduced margins for the price of the clock and data recovery circuit.

The built in self test (BIST) feature of the test control unit 810 of the present invention reduces the amount of time and test equipment that is required to characterize the clock and data recovery circuit 800. This reduction in the amount of time and test equipment increases the manufacturing profit margin for the clock and data recovery circuit 800.

The operation of the test control unit 810 will now be considered in more detail. The test control unit 810 provides a self test capability that allows it to test several of the elements of the clock and data recovery circuit 800 in an open loop mode. One test begins with the bank of parallel flip flops that sample the data available in the shift registers (550, 560, 570, 580) of data alignment path unit 410. These parallel flip flops feed the data to the phase detectors 415.

The clock and data recovery (CDR) loop is broken open by forcing the outputs of the parallel flip flops to generate certain patterns of zeros ("0") and ones ("1"). These patterns cause the phase detectors 415 to generate early or late signals in various combinations as desired.

For example, the phase detectors 415 can be all forced to generate early signals. If the accumulator bit depth of the digital filter block 650 of the digital control circuitry 420 is set to two (2), then these four (4) early signals cause the accumulator of the digital filter block 650 to move by four positions in the clockwise direction every clock cycle. In turn, the digital filter block 650 will generate an "up" signal every clock cycle.

This "up" signal causes the finite state machine 660 to step the phase position up once every clock cycle. This causes the recovered (i.e., interpolated) clock signal to have a slightly higher frequency relative to the reference frequency that it receives from the clock generator.

This skewed clock signal is divided down by a factor of ten (10) and is subsequently fed to the external digital processing block. This block nominally operates at the same frequency as the divide-by-ten (10) recovered clock. However, it derives its clock signal from the on-chip phase locked loop (PLL) which does not shift in frequency. This means that there will be a frequency difference between the divide-by-ten (10) recovered clock frequency and the clock frequency of the digital control circuitry 420. The frequency difference between the two clocks is measured by the digital control circuitry 420 by using counters. The status of the clock and data recovery circuit 800 can be declared to be "passing" if the frequency difference has the expected value based on the test settings.

The test control unit 810 measures the frequency difference by employing two digital counters that are each thirteen (13) bits wide. One of the counters is driven by the reference clock while the other counter is driven by the divide-by-ten (10) interpolated clock. In the example cited above, the interpolated clock counter will reach its final count first and will produce an overflow signal. This overflow signal causes the other counter to freeze and the difference between the two counts is calculated. This difference is directly related to the frequency difference between the two clocks.

The clock and data recovery circuit 800 is programmed for sixteen (16) different frequency skews depending upon the phase detector pattern accumulator depths. The test control unit 810 can test the clock and data recovery circuit 800 to see if the expected frequency difference is observed and then send out either a "pass" signal or a "fail" signal.

This test begins by imposing a bit pattern at the input of the phase detectors 415 and ends by measuring the recovered clock frequency at the output of the phase interpolators 425. Therefore the test path is from the phase detectors 415, through the digital filter block 650, through the finite state machine 660, and through the phase interpolators 425. This means that the test effectively tests more than seventy percent (70%) of the clock and data recovery (CDR) loop in a very short amount of time without requiring the use of a sophisticated external test system. As previously mentioned, the self test feature achieves a significant reduction in cost.

Although the present invention has been described with an exemplary embodiment, various changes and modifications may be suggested to one skilled in the art. It is intended that the present invention encompass such changes and modifications as fall within the scope of the appended claims.

What is claimed is:

1. A test control unit within a clock and data recovery circuit that comprises a plurality of comparators, a data alignment path unit, a plurality of phase detectors, digital control circuitry, and a plurality of phase interpolators, connected in a loop configuration in which the plurality of comparators are connected to the data alignment path unit and the data alignment path unit is connected to the plurality of phase detectors and the plurality of phase detectors are connected to the digital control circuitry and the digital control circuitry is connected to the plurality of phase interpolators and the plurality of phase interpolators are connected to the plurality of comparators, wherein said test control unit comprises:

test control circuitry that receives from the clock and data recovery circuit signals that indicate an operational status of the clock and data recovery circuit and that determines from the received signals whether the operational status of the clock and data recovery circuit passes or fails a test that is performed by the test control circuitry, wherein said test control circuitry comprises:

first electronic circuitry that causes said clock and data recovery circuit to continuously alter a phase of an interpolated clock signal within said clock and data recovery circuit;

second electronic circuitry that receives at least one preselected bit pattern from a user of said test control unit; and third electronic circuitry that imposes said at least one preselected bit pattern on an input of said plurality of phase detectors.

2. The test control unit as set forth in claim 1 wherein said at least one preselected bit pattern causes said digital control circuitry to advance a phase of said interpolated clock signal.

3. The test control unit as set forth in claim 1 wherein said at least one preselected bit pattern causes said digital control circuitry to retard a phase of said interpolated clock signal.

4. The test control unit as set forth in claim 2 wherein said test control unit receives an on-chip system clock signal, and wherein said test control unit receives a value of an advanced phase of said interpolated clock signal from said plurality of phase interpolators, and wherein said test control unit compares said value of said advanced phase of said interpolated clock signal with a value of said on-chip system clock signal to determine a value of frequency difference between the two clock signals.

5. The test control as set forth in claim 4 wherein said test control unit in response to said value of frequency difference between said two clock signals signifies a status of said clock and data recovery circuit by asserting on a signal line one of: a pass signal and a fail signal.

6. The test control unit as set forth in claim 3 wherein said test control unit receives an on-chip system clock signal, and wherein said test control unit receives a value of a retarded phase of said interpolated clock signal from said plurality of phase interpolators, and wherein said test control unit compares said value of said retarded phase of said interpolated clock signal with a value of said on-chip system clock signal to determine a value of frequency difference between the two clock signals.

7. The test control unit as set forth in claim 6 wherein said test control unit in response to said value of frequency difference between said two clock signals signifies a status of said clock and data recovery circuit by asserting on a signal line one of: a pass signal and a fail signal.

8. The test control unit as set forth in claim 1 wherein said third electronic circuitry that imposes said at least one preselected bit pattern on an input of said plurality of phase detectors comprises a bank of parallel flip flops in said test control unit.

9. The test control unit as set forth in claim 4 wherein said test control unit compares said value of said advanced phase of said interpolated clock signal with said value of said on-chip system clock signal to determine said value of frequency difference by using a first digital counter driven by said on-chip system clock signal and a second digital counter driven by a divide-by-ten interpolated clock signal.

10. The test control unit as set forth in claim 6 wherein said test control unit compares said value of said retarded phase of said interpolated clock signal with said value of said on-chip system clock signal to determine said value of frequency difference by using a first digital counter driven by said on-chip system clock signal and a second digital counter driven by a divide-by-ten interpolated clock signal.

11. The test control unit as set forth in claim 1 wherein said second electronic circuitry that receives at least one preselected bit pattern from a user of said test control unit receives sixteen different preselected bit patterns in which each preselected bit pattern generates a frequency skew.

12. A method for testing a clock and data recovery circuit that comprises a plurality of comparators, a data alignment path unit, a plurality of phase detectors, digital control circuitry, and a plurality of phase interpolators, connected in a loop configuration in which the plurality of comparators are connected to the data alignment path unit and the data alignment path unit is connected to the plurality of phase detectors and the plurality of phase detectors are connected to the digital control circuitry and the digital control circuitry is connected to the plurality of phase interpolators and the plurality of phase interpolators are connected to the plurality of comparators, said method comprising the steps of:

coupling a test control unit to said clock and data recovery circuit; and receiving in said test control unit signals from the clock and data recovery circuit that indicate an operational status of the clock and data recovery circuit;

performing in said test control unit a test of the operational status of the clock and data recovery circuit using the received signals; and determining whether the operational status of the clock and data recovery circuit passes or fails the test;

wherein performing the test of the operational status of the clock and data recovery circuit comprises:

sending the received signals to said test control unit to cause said clock and data recovery circuit to continuously alter a phase of an interpolated clock signal within said clock and data recovery circuit;

receiving in said test control unit at least one preselected bit pattern from a user of said test control unit; and imposing said at least one preselected bit pattern on an input of said plurality of phase detectors.

13. The method as set forth in claim 12 further comprising the step of:

causing said digital control circuitry to advance a phase of said interpolated clock signal in response to said at least one preselected bit pattern.

14. The method as set forth in claim 12 further comprising the step of:

causing said digital control circuitry to retard a phase of said interpolated clock signal in response to said at least one preselected bit pattern.

15. The method as set forth in claim 13 further comprising the steps of:

receiving in said test control unit an on-chip system clock signal;

receiving in said test control unit a value of an advanced phase of said interpolated clock signal from said plurality of phase interpolators;

comparing in said test control unit said value of said advanced phase of said interpolated clock signal with a value of said on-chip system clock signal; and determining in said test control unit a value of frequency difference between the two clock signals.

16. The method as set forth in claim 15 further comprising the step of:

in response to said value of frequency difference between said two clock signals signifying a status of said clock and data recovery circuitry by asserting on a signal line one of: a pass signal and a fail signal.

17. The method as set forth in claim 14 further comprising the steps of:

receiving in said test control unit an on-chip system clock signal;

receiving in said test control unit a value of a retarded phase of said interpolated clock signal from said plurality of phase interpolators;

comparing in said test control unit said value of said retarded phase of said interpolated clock signal with a value of said on-chip system clock signal; and determining in said test control unit a value of frequency difference between the two clock signals.

18. The method as set forth in claim 17 further comprising the step of:

in response to said value of frequency difference between said two clock signals signifying a status of said clock and data recovery circuitry by asserting on a signal line one of: a pass signal and a fail signal.

* * * * *